(12) United States Patent
Mukai

(10) Patent No.: US 10,134,561 B2
(45) Date of Patent: Nov. 20, 2018

(54) ELECTRON MICROSCOPE AND METHOD OF CONTROLLING SAME

(71) Applicant: JEOL Ltd., Tokyo (JP)

(72) Inventor: Masaki Mukai, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/591,331

(22) Filed: May 10, 2017

(65) Prior Publication Data
US 2017/0330723 A1 Nov. 16, 2017

(30) Foreign Application Priority Data
May 11, 2016 (JP) .................................. 2016-95193

(51) Int. Cl.
| | |
|---|---|
| *H01J 37/24* | (2006.01) |
| *H01J 37/05* | (2006.01) |
| *H01J 37/06* | (2006.01) |
| *H01J 37/147* | (2006.01) |
| *H01J 37/26* | (2006.01) |
| *H01J 37/317* | (2006.01) |

(52) U.S. Cl.
CPC .............. *H01J 37/24* (2013.01); *H01J 37/05* (2013.01); *H01J 37/06* (2013.01); *H01J 37/147* (2013.01); *H01J 37/26* (2013.01); *H01J 37/265* (2013.01); *H01J 37/3178* (2013.01); *H01J 2237/0473* (2013.01); *H01J 2237/04735* (2013.01); *H01J 2237/057* (2013.01)

(58) Field of Classification Search
USPC ....................................................... 250/306
See application file for complete search history.

(56) References Cited

U.S. PATENT DOCUMENTS

| | | | | |
|---|---|---|---|---|
| 3,292,041 A | * | 12/1966 | Katagiri .................. | H01J 3/028 313/146 |
| 3,731,211 A | * | 5/1973 | Purser ...................... | H01J 5/06 313/361.1 |

(Continued)

FOREIGN PATENT DOCUMENTS

JP 201639119 A 3/2016

*Primary Examiner* — Phillip A Johnston
(74) *Attorney, Agent, or Firm* — The Webb Law Firm

(57) ABSTRACT

There is provided an electron microscope in which a crossover position can be kept constant. The electron microscope (100) includes: an electron source (110) for emitting an electron beam; an acceleration tube (170) having acceleration electrodes (170a-170f) and operative to accelerate the electron beam; a first electrode (160) operative such that a lens action is produced between this first electrode (160) and the initial stage of acceleration electrode (170a); an accelerating voltage supply (112) for supplying an accelerating voltage to the acceleration tube (170); a first electrode voltage supply (162) for supplying a voltage to the first electrode (160); and a controller (109b) for controlling the first electrode voltage supply (162). The lens action produced between the first electrode (160) and the initial stage of acceleration electrode (170a) forms a crossover (CO2) of the electron beam. The controller (109b) controls the first electrode voltage supply (162) such that, if the accelerating voltage is modified, the ratio between the voltage applied to the first electrode (160) and the voltage applied to the initial stage of acceleration electrode (170a) is kept constant.

9 Claims, 8 Drawing Sheets

(56) References Cited

U.S. PATENT DOCUMENTS

| | | | | |
|---|---|---|---|---|
| 4,642,461 A | * | 2/1987 | Endo | H01J 37/073 |
| | | | | 250/311 |
| 4,945,247 A | * | 7/1990 | Kawasaki | H01J 37/073 |
| | | | | 250/423 F |
| 6,960,763 B2 | * | 11/2005 | Lopez | H01J 37/05 |
| | | | | 250/281 |
| 2013/0087703 A1 | * | 4/2013 | Onishi | H01J 37/065 |
| | | | | 250/306 |

* cited by examiner

ELECTRON MICROSCOPE AND METHOD OF CONTROLLING SAME

BACKGROUND OF THE INVENTION

Field of the Invention

The present invention relates to an electron microscope and a method of controlling it.

Description of Related Art

Generally, a monochromator is composed of an energy filter (which is an electron beam splitter) and an energy-selecting slit. When an electron beam impinges on the monochromator, the beam creates a spectrum corresponding to the energy distribution of the beam on the plane of the energy-selecting slit placed on the energy dispersive plane owing to spectral dispersion caused by the energy filter. Because the energy-selecting slit is used for this spectrum, only a part of the electron beam having a certain energy width corresponding to the slit width of the energy-selecting slit is made to pass through the slit. As a result, the electron beam is monochromatized. Such a monochromator is disclosed, for example, in JP-A-2016-039119.

FIG. 7 schematically illustrates a conventional electron gun 1A. As shown in this figure, the electron gun 1A incorporates a monochromator 4. The structure of the electron gun 1A is first described.

Referring still to FIG. 7, the electron gun 1A is configured including an electron source 1, an extraction electrode 2, the monochromator 4, an entrance side electrode 3 disposed at the entrance of the monochromator 4, an exit side electrode 5 disposed at the exit of the monochromator 4, and an acceleration tube 6. The acceleration tube 6 has plural stages of acceleration electrodes 6a-6f stacked one above the other.

The electron source 1 has a cathode (filament), which in turn is connected with a filament power supply 11. The energy filter incorporated in the monochromator 4 is made up of plural electrodes and plural magnetic coils for exciting polepieces. The electrodes are connected with a voltage control power supply 14c for the electrodes, while the magnetic coils are connected with a current control power supply 14b for the magnetic coils.

The extraction electrode 2, entrance side electrode 3, monochromator 4 (its enclosure), and exit side electrode 5 are connected with an extraction side electrode voltage supply 12, an entrance side electrode voltage supply 13, a monochromator voltage supply 14a, and an exit side electrode voltage supply 15, respectively. The acceleration tube 6 is coupled to an accelerating voltage supply 10.

The operation of the electron gun 1A is next described. An electron beam extracted from the electron source 1 with the extraction electrode 2 is made to follow a parallel orbit by an electrostatic lens EL1 produced between the entrance side electrode 3 and the monochromator 4, and impinges on the monochromator 4. The beam is then monochromatized by the monochromator 4. The monochromatized beam is again collimated at the exit of the monochromator 4. An electrostatic lens EL2 produced between the monochromator 4 and the exit side electrode 5 forms a crossover at the position of the exit side electrode 5. Similarly, an electrostatic lens EL3 generated between the exit side electrode 5 and the top stage of acceleration electrode 6a of the acceleration tube 6 forms a crossover CO at the position of the exit of the acceleration tube 6.

In the electron gun 1A, the potential distribution on the optical axis of the monochromator 4 is kept constant at all times, and the electron-optical settings of the energy filter are also maintained unaltered. Therefore, the resolution of the energy filter is maintained constant. As a matter of course, the potential distribution on the optical axis in the vicinity of the electron source 1 is kept constant at all times and thus the potential distribution on the optical axis from the electron source 1 to the monochromator 4 is maintained constant at all times. Consequently, in the electron gun 1A, as long as the accelerating voltage is constant, the magnitudes of all the electrostatic lenses EL1, EL2, and EL3 are kept constant, and these electrostatic lenses are set at all times for the same optical system.

In recent years, the technology for correcting spherical aberrations in electron microscopes has evolved. As a result, even in the case of electron microscopes using low accelerating voltages such as less than 100 kV, their spatial resolutions have reached atomic scales. It is anticipated that a low-accelerating voltage, aberration-corrected electron microscope equipped with a monochromator will produce transmission electron microscope images of higher spatial resolution owing to lower chromatic aberration brought about by the monochromator and improvement of accuracy of analysis of electron energy loss spectroscopy owing to increases in inelastic scattering cross section of samples achieved by low accelerating voltages. Therefore, electron guns incorporating a monochromator are required to find applications using accelerating voltages less than 100 kV, as well as applications using conventional, general-purpose accelerating voltages of 200 kV.

If the electron gun 1A shown in FIG. 7 is used at a low accelerating voltage, the voltage applied to the top stage of acceleration electrode 6a of the acceleration tube 6 drops and so the magnitude of the electrostatic lens EL3 produced between the exit side electrode 5 and the acceleration electrode 6a decreases, i.e., the lens action weakens. This varies the position of the crossover CO. As a result, an electron beam brightness needed to enable imaging in the electron microscope may not be obtained.

Furthermore, in an electron gun equipped with no monochromator, if the extraction voltage for extracting an electron beam is varied, the position of the crossover changes. As a result, it may be impossible to obtain an electron beam brightness needed for imaging.

FIG. 8 schematically shows another conventional electron gun 1B. As shown in this figure, the electron gun 1B has no monochromator therein. The electron gun 1B is configured including an electron source 1, an extraction electrode 2, an acceleration tube 6, and an electrode 7 disposed on the entrance side of the acceleration tube 6. The electrode 7 is connected with a voltage supply 17.

An electron beam is extracted from the electron source 1 by the extraction electrode 2. The orbit of the electron beam is adjusted by an electrostatic lens EL4 produced between the extraction electrode 2 and the electrode 7. Another electrostatic lens EL5 produced between the electrode 7 and the acceleration tube 6 forms a crossover CO at the position of the exit of the acceleration tube 6.

In the electron gun 1B, the extraction voltage imposed on the extraction electrode 2 is modified in order to adjust the magnitude of the electron beam (i.e., the amount of electrons) emitted from the electron source 1. At this time, the voltage applied to the electrode 7 must be modified according to the extraction voltage in order to maintain the lens action of the electrostatic lens EL4 constant such that the orbit of the electron beam is prevented from varying.

However, if the voltage applied to the electrode 7 is modified, the magnitude of the electrostatic lens EL5 varies and so the position of the crossover CO changes. As a result, an electron beam brightness needed for imaging in the electron microscope may not be obtained.

SUMMARY OF THE INVENTION

In view of the foregoing problem, the present invention has been made. One object associated with some aspects of the present invention is to provide an electron microscope and control method capable of maintaining the crossover position unchanged.

(1) An electron microscope associated with the present invention includes: an electron source for emitting an electron beam; an acceleration tube which has plural stages of acceleration electrodes stacked one above the other and which is operative to accelerate the electron beam; a first electrode placed in a stage preceding the acceleration tube and operative such that a lens action is produced between this first electrode and the initial stage of acceleration electrode of the plural stages of acceleration electrodes; an accelerating voltage supply for supplying an accelerating voltage to the acceleration tube; a first electrode voltage supply for supplying a voltage to the first electrode; and a controller for controlling the first electrode voltage supply. The lens action produced between the first electrode and the initial stage of acceleration electrode forms a crossover of the electron beam. The controller controls the first electrode voltage supply such that, if the accelerating voltage is modified, the ratio between the voltage applied to the first electrode and the voltage applied to the initial stage of acceleration electrode is kept constant.

In this electron microscope, the controller controls the first electrode voltage supply in such a way that, if the accelerating voltage is modified, the ratio between the voltage applied to the first electrode and the voltage applied to the initial stage of acceleration electrode is kept constant. Therefore, if the accelerating voltage is altered, the lens action occurring between the first electrode and the initial stage of acceleration electrode can be maintained constant. Accordingly, in this electron microscope, if the accelerating voltage is changed, the position of the crossover of the electron beam formed by the lens action produced between the first electrode and the initial stage of acceleration electrode can be kept constant.

(2) In one feature of the electron microscope of (1) above, there may be further provided: a monochromator for monochromatizing the electron beam; an entrance side electrode disposed on an entrance side of the monochromator and operative such that a lens action is produced between this entrance side electrode and the monochromator; and an exit side electrode disposed on an exit side of the monochromator and operative such that a lens action is produced between this exit side electrode and the monochromator.

Because this electron microscope includes the monochromator, it is possible to perform electron energy loss spectroscopy at high energy resolutions and TEM imaging at high spatial resolutions.

(3) In one feature of the electron microscope of (2) above, there may be further provided a deflector disposed between the exit side electrode and the first electrode and operative to deflect the electron beam.

Because this electron microscope includes the deflector disposed between the exit side electrode and the first electrode, it is possible to correct axial deviation of the electron beam occurring when the voltage applied to the first electrode is varied. In consequence, in this electron microscope, aberrations arising from an axial deviation of the electron beam can be reduced.

(4) In one feature of the electron microscope of (3) above, the deflector may be placed at the position of the crossover of the electron beam formed by the lens action produced between the monochromator and the exit side electrode.

In this electron microscope, the deflector is located at the position of the crossover of the electron beam formed by the lens action that occurs between the monochromator and the exit side electrode. Therefore, only the angle of incidence of the electron beam relative to the optical system can be adjusted.

(5) In another feature of the electron microscope of (1) above, there may be, further provided: an extraction electrode for extracting the electron beam from the electron source; and a second electrode operative such that a lens action is produced between this second electrode and the extraction electrode.

(6) In one feature of the electron microscope of (5) above, there may be further included: an extraction electrode voltage supply for supplying an extraction voltage to the extraction electrode; and a second electrode voltage supply for supplying a voltage to the second electrode. The controller may further control the second electrode voltage supply such that, if the extraction voltage is modified, the ratio between the voltage applied to the extraction electrode and the voltage applied to the second electrode is kept constant.

In this electron microscope, the controller controls the second electrode voltage supply such that, if the extraction voltage is modified, the ratio between the voltage applied to the extraction electrode and the voltage applied to the second electrode is kept constant. Therefore, if the extraction voltage is modified, the lens action occurring between the extraction electrode and the second electrode can be made constant. Consequently, in this electron microscope, if the extraction electrode is altered, the lens action occurring between the extraction electrode and the second electrode will not affect the orbit of the electron beam.

(7) Another electron microscope associated with the present invention includes: an electron source for emitting an electron beam; an extraction electrode for extracting the electron beam from the electron source; an acceleration tube which has plural stages of acceleration electrodes stacked one above the other and which is operative to accelerate the electron beam; a first electrode placed in a stage preceding the acceleration tube and operative such that a lens action is produced between this first electrode and the initial stage of acceleration electrode of the plural stages of acceleration electrodes; a second electrode disposed between the extraction electrode and the first electrode and operative such that a lens action is produced between this second electrode and the extraction electrode; an extraction electrode voltage supply for supplying an extraction voltage to the extraction electrode; a second electrode voltage supply for supplying a voltage to the second electrode; and a controller for controlling the second electrode voltage supply. The lens action produced between the first electrode and the initial stage of acceleration electrode forms a crossover of the electron beam. The controller controls the second electrode voltage supply such that, if the extraction voltage is modified, the ratio between the voltage applied to the extraction electrode and the voltage applied to the second electrode is kept constant.

In this electron microscope, the controller controls the second electrode voltage supply such that, if the extraction voltage is modified, the ratio between the voltage applied to the extraction electrode and the voltage applied to the second electrode is kept constant. Therefore, if the extraction voltage is varied, the lens action occurring between the extraction electrode and the second electrode can be made constant. Consequently, in this electron microscope, if the extraction voltage is modified, the lens action produced between the extraction electrode and the second electrode does not affect the orbit of the electron beam.

Furthermore, this electron microscope has the first electrode and so if the extraction voltage is modified, the lens action occurring between the first electrode and the initial stage of acceleration electrode is not affected. Accordingly, in this electron microscope, if the extraction voltage is modified, the position of the crossover of the electron beam formed by the lens action produced between the first electrode and the initial stage of acceleration electrode can be maintained unchanged.

(8) A method of controlling an electron microscope in accordance with the present invention is implemented in the electron microscope including an electron source for emitting an electron beam, an acceleration tube which has plural stages of acceleration electrodes stacked one above the other and which is operative to accelerate the electron beam; a first electrode placed in a stage preceding the acceleration tube and operative such that a lens action is produced between this first electrode and the initial stage of acceleration electrode of the plural stages of acceleration electrodes, an accelerating voltage supply for supplying an accelerating voltage to the acceleration tube, and a first electrode voltage supply for supplying a voltage to the first electrode. A lens action produced between the first electrode and the initial stage of acceleration electrode forms a crossover of the electron beam. The method involves controlling the first electrode voltage supply such that, if the accelerating voltage is modified, the ratio between the voltage applied to the first electrode and the voltage applied to the initial stage of acceleration electrode is kept constant.

In this method of controlling an electron microscope, the first electrode voltage supply is controlled such that, if the accelerating voltage is modified, the ratio between the voltage applied to the first electrode and the voltage applied to the initial stage of acceleration electrode is kept constant. Therefore, if the accelerating voltage is modified, the lens action occurring between the first electrode and the initial stage of acceleration electrode can be made constant. Consequently, if the accelerating voltage is modified, the position of the crossover of the electron beam formed by the lens action produced between the first electrode and the initial stage of acceleration electrode can be maintained unchanged.

(9) Another method of controlling an electron microscope in accordance with the present invention is implemented in the electron microscope including an electron source for emitting an electron beam, an extraction electrode for extracting the electron beam from the electron source, an acceleration tube which has plural stages of acceleration electrodes stacked one above the other and which is operative to accelerate the electron beam; a first electrode placed in a stage preceding the acceleration tube and operative such that a lens action is produced between this first electrode and the initial stage of acceleration electrode of the plural stages of acceleration electrodes, a second electrode disposed between the extraction electrode and the first electrode and operative such that a lens action is produced between this second electrode and the extraction electrode, an extraction electrode voltage supply for supplying an extraction voltage to the extraction electrode, and a second electrode voltage supply for supplying a voltage to the second electrode. The lens action produced between the first electrode and the initial stage of acceleration electrode forms a crossover of the electron beam. The method involves controlling the second electrode voltage supply such that, if the extraction voltage is modified, the ratio between the voltage applied to the extraction electrode and the voltage applied to the second electrode is kept constant.

In this method of controlling an electron microscope, the second electrode voltage supply is controlled so that, if the extraction voltage is modified, the ratio between the voltage applied to the extraction electrode and the voltage applied to the second electrode is kept constant. Therefore, if the extraction voltage is modified, the lens action produced between the extraction electrode and the second electrode can be made constant. Consequently, if the extraction voltage is modified, the lens action produced between the extraction electrode and the second electrode does not affect the orbit of the electron beam.

Furthermore, in this method of controlling an electron microscope, since the electron microscope has the first electrode, if the extraction voltage is modified (i.e., the voltage applied to the extraction electrode or the voltage applied to the second electrode is modified), the lens action produced between the first electrode and the initial stage of acceleration electrode is not affected. As a consequence, in this electron microscope, if the extraction voltage is modified, the position of the crossover of the electron beam formed by the lens action produced between the first electrode and the initial stage of acceleration electrode can be kept constant.

DESCRIPTION OF THE INVENTION

The preferred embodiments of the present invention are hereinafter described in detail with reference to the drawings. It is to be understood that the embodiments described below are not intended to unduly restrict the content of the present invention delineated by the appended claims and that not all the configurations described below are essential constituent components of the invention.

1. First Embodiment

1.1. Configuration of Electron Microscope

Figure 1:
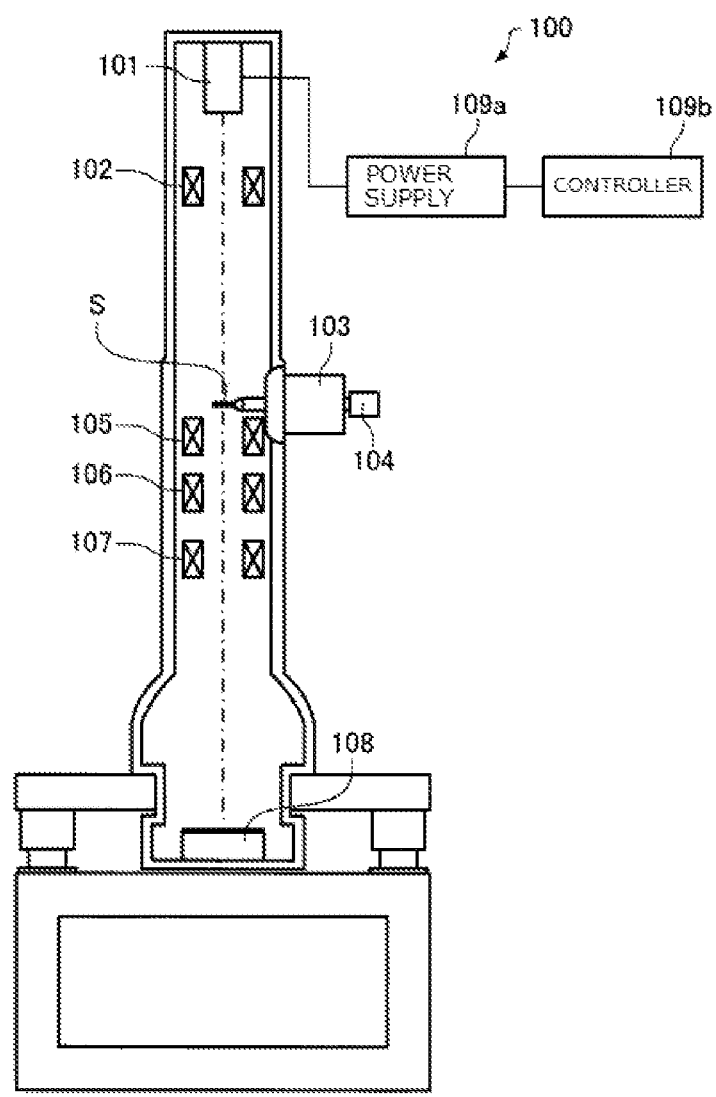
FIG. 1 is a schematic cross section, partly in block form, of an electron microscope (EM) associated with a first embodiment of the present invention.

An electron microscope associated with a first embodiment of the present invention is first described by referring to FIG. 1, which schematically shows the electron microscope, 100. As shown in FIG. 1, the electron microscope 100 is configured including an electron gun 101, condenser lenses 102, a sample stage 103, a sample holder 104, an objective lens 105, an intermediate lens 106, a projector lens 107, an imager 108, a power supply 109a, and a controller 109b.

The electron gun 101 emits an electron beam. A monochromator is incorporated in the electron gun 101. Details of the electron gun 101 will be described later.

The electron beam emitted from the electron gun 101 is focused onto a sample S by the condenser lenses 102. The sample stage 103 holds the sample S. In the illustrated example, the sample stage 103 holds the sample S via the sample holder 104. The sample stage 103 permits the sample S to be placed in position.

The objective lens 105 is an initial stage of lens for imaging the electron beam transmitted through the sample S so as to create a TEM (transmission electron microscope) image. The intermediate lens 106 and the projector lens 107 cooperate to further magnify the image focused by the objective lens 105 and to focus the further magnified image onto the imager 108. The objective lens 105, intermediate lens 106, and projector lens 107 together constitute an imaging system of the electron microscope 100.

The imager 108 captures the TEM image focused by the imaging system. The imager 108 is a digital camera such as a CCD camera, for example.

The power supply 109a supplies voltages and currents to the electron gun 101. Details of the power supply 109a will be described later.

The controller 109b controls the power supply 109a. The functions of the controller 109b may be implemented either by dedicated circuitry or by causing a CPU (central processing unit) to execute control programs stored in a storage device such as a ROM (read only memory) or a RAM (random access memory). Details of the controller 109b will be described later.

Figure 2:
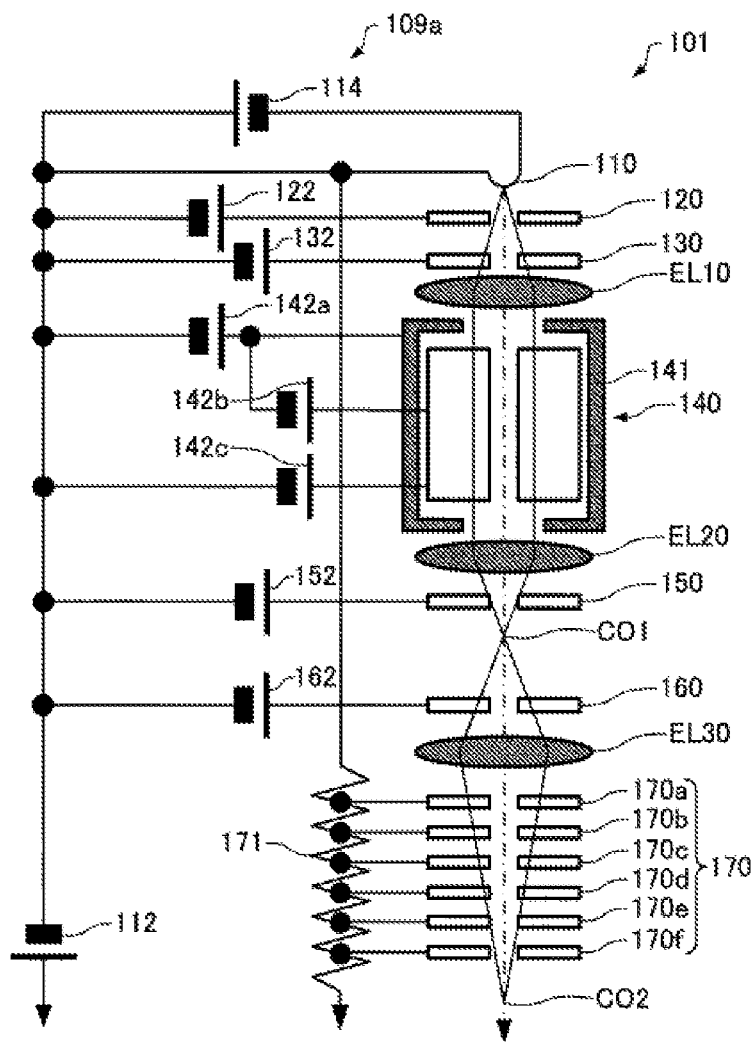
FIG. 2 is a schematic cross section, partly in circuit diagram form, of an electron gun included in the electron microscope of FIG. 1.

FIG. 2 schematically shows the electron gun 101 of the electron microscope 100 associated with the first embodiment. As shown in FIG. 2, the electron gun 101 is configured including an electron source 110, an extraction electrode 120, a monochromator 140, an entrance side electrode 130 disposed on the entrance side of the monochromator 140, an exit side electrode 150 disposed on the exit side of the monochromator 140, an acceleration tube 170, and an inlet electrode (first electrode) 160 placed in a stage preceding (on the upstream side relative to the direction of flow of the electron beam) the acceleration tube 170.

The electron source 110 emits an electron beam. The electron source 110 has a cathode (filament), which is connected with a filament current supply 114.

The extraction electrode 120 operates to extract the electron beam from the electron source 110. The extraction electrode 120 is connected with an extraction electrode voltage supply 122. An extraction voltage on the order of kV with respect to the electron source 110 (cathode) is applied to the extraction electrode 120.

The entrance side electrode 130 is placed in a stage following (i.e., on the downstream side relative to the direction of flow of the electron beam) the extraction electrode 120. A lens action is produced between the entrance side electrode 130 and the monochromator 140. In the example shown in FIG. 2, the entrance side electrode 130 and monochromator 140 cooperate to produce an electrostatic lens EL10. The entrance side electrode 130 is connected with an entrance side electrode voltage supply 132.

The electrostatic lens EL10 adjusts the orbit of the electron beam emitted from the electron source 110. For example, the electrostatic lens EL10 collimates the electron beam before it impinges on the monochromator 140.

The monochromator 140 monochromatizes the electron beam. The monochromator 140 is configured including an energy filter for spectrally dispersing the electron beam, an energy-selecting slit, and an enclosure 141 that accommodates both energy filter and energy-selecting slit.

The energy filter is composed of plural electrodes and plural magnetic coils for exciting polepieces. The electron beam is spectrally dispersed by the electromagnetic fields produced by these electrodes and magnetic coils. The energy-selecting slit extracts a part of the electron beam having a certain energy width corresponding to the slit width. The enclosure 141 stabilizes the potential of the electron beam passing through the energy filter and energy-selecting slit. Consequently, the operation of the energy filter can be stabilized.

The electrodes of the energy filter are connected with an energy filter electrode voltage supply 142c. The magnetic coils of the energy filter are connected with an energy filter coil current supply 142b. The enclosure 141 of the monochromator 140 is connected with a monochromator voltage supply 142a.

The exit side electrode 150 is placed in a stage following the monochromator 140. A lens action is produced between the exit side electrode 150 and the monochromator 140. In the example shown in FIG. 2, the exit side electrode 150 and monochromator 140 cooperate to produce an electrostatic lens EL20, which in turn focuses the electron beam and forms a crossover CO1 between the exit side electrode 150 and the inlet electrode 160. The exit side electrode 150 is connected with an exit side electrode voltage supply 152.

The inlet electrode 160 is disposed in the rear of the exit side electrode 150. A lens action is produced between the inlet electrode 160 and the top stage of acceleration electrode 170a of the acceleration tube 170. In the example shown in FIG. 2, the inlet electrode 160 and top stage of acceleration electrode 170a cooperate to produce an electrostatic lens EL30, which in turn focuses the electron beam and forms a crossover CO2 at the exit of the acceleration tube 170. The inlet electrode 160 is connected with an inlet electrode voltage supply (also referred to as a first electrode voltage supply) 162.

The acceleration tube 170 is positioned in a stage subsequent to the inlet electrode 160. The acceleration tube 170 has plural stages (6 stages in the illustrated example) of acceleration electrodes 170a-170f stacked one above the other. The acceleration tube 170 is connected with an accelerating voltage supply 112. An accelerating voltage applied from the accelerating voltage supply 112 is divided by a voltage dividing circuit 171 and applied to the acceleration electrodes 170a-170f. The multiple stages of acceleration electrodes 170a-170f permit the electron beam to be accelerated successively up to a desired voltage.

As noted above, the lens action (electrostatic lens EL30) is produced between the top stage of acceleration electrode 170a (initial stage of acceleration electrode) of the multiple stages of acceleration electrodes 170a-170f and the inlet electrode 160.

The power supply 109a is configured including the accelerating voltage supply 112, the filament current supply 114, the extraction electrode voltage supply 122, the inlet electrode voltage supply 132, the monochromator voltage supply 142a, the energy filter coil current supply 142b, the energy filter electrode voltage supply 142c, the exit side electrode voltage supply 152, and the inlet electrode voltage supply 162.

The accelerating voltage supply 112 supplies the accelerating voltage for accelerating the electron beam produced from the electron source 110. The accelerating voltage is applied between the electron source 110 (cathode) and the acceleration tube 170.

The filament current supply 114 supplies a filament current to the electron source (cathode) 110. The extraction electrode voltage supply 122 supplies an extraction voltage to the extraction electrode 120. The extraction voltage is applied to the extraction electrode 120 to extract the electron beam from the electron source 110. The entrance side electrode voltage supply 132 supplies a voltage to the entrance side electrode 130.

The monochromator voltage supply 142a supplies an enclosure voltage to the enclosure 141 of the monochromator 140. This can electrically stabilize the enclosure 141.

The energy filter coil current supply 142b supplies currents to the magnetic coils which are used in the energy filter of the monochromator 140 to excite polepieces. The energy filter coil current supply 142b takes the output voltage (enclosure voltage) of the monochromator voltage supply 142a as ground potential (reference potential). The energy filter electrode voltage supply 142c supplies voltages to the electrodes used in the energy filter of the monochromator 140.

The exit side electrode voltage supply 152 supplies a voltage to the exit side electrode 150. The inlet electrode voltage supply 162 supplies a voltage to the inlet electrode 160. The extraction electrode voltage supply 122, the entrance side electrode voltage supply 132, the monochromator voltage supply 142a, the energy filter electrode voltage supply 142c, the exit side electrode voltage supply 152, and the inlet electrode voltage supply 162 take the output voltage of the accelerating voltage supply 112 as ground potential (reference potential).

All of the extraction electrode voltage supply 122, the entrance side electrode voltage supply 132, the monochromator voltage supply 142a, the energy filter electrode voltage supply 142c, the exit side electrode voltage supply 152, and the inlet electrode voltage supply 162 can control their respective output voltages independently of each other. In addition, the outputs of these voltage supplies 122, 132, 142a, 142c, 152, and 162 are superimposed on the accelerating voltage and so these power supplies can control their respective outputs independently of the accelerating voltage.

The output of the energy filter coil current supply 142b is superimposed on the output of the monochromator voltage supply 142a so as to minimize the potential difference relative to the monochromator 140, taking account of the withstand voltages of the magnetic coils which are incorporated in the energy filter to excite the polepieces.

The controller 109b controls the inlet electrode voltage supply 162. If the accelerating voltage is modified, the controller 109b controls the inlet electrode voltage supply 162 such that the ratio between the voltage applied to the inlet electrode 160 and the voltage applied to the accelerating electrode 170a is kept constant.

1.2. Operation of Electron Microscope

The operation of the electron microscope 100 is next described. The electron beam extracted from the electron source 110 by the extraction electrode 120 is collimated by the electrostatic lens EL10 produced between the entrance side electrode 130 and the monochromator 140 and impinges on the monochromator 140.

In the monochromator 140, a deflecting field is produced in the electron beam path by the energy filter. The electron beam is spectrally dispersed by making use of variations in orbit caused by variations in electron velocity across the deflecting field. A spectrum corresponding to the energy distribution of the electron beam emitted from the electron source 110 is projected onto the energy-selecting slit. The resolution of the energy filter is on the order of 10 µm/eV. An energy distribution corresponding to the slit width is imparted to the electron beam by passing the beam through the slit having a width from several microns to submicrons. As a result, the electron beam is monochromatized.

The electron beam that is again collimated at the exit position of the monochromator 140 is focused by the electrostatic lens EL20 produced between the monochromator 140 and the exit side electrode 150 and forms the crossover CO1 between the exit side electrode 150 and the inlet electrode 160.

The electron beam undergoing a lens action from the electrostatic lens EL20 is focused by the electrostatic lens EL30 produced between the inlet electrode 160 and the top stage of acceleration electrode 170a and enters the acceleration tube 170 in which the beam is accelerated by the acceleration tube 170. A lens action of the electrostatic lens EL30 forms a crossover CO2 of the accelerated electron beam at the exit of the acceleration tube 170.

In this way, the electron beam is emitted from the electron gun 101. The electron beam is then focused by the condenser lenses 102 and made to impinge on the sample S. The electron beam transmitted through the sample S passes through the objective lens 105, intermediate lens 106, and projector lens 107. At this time, the objective lens 105, intermediate lens 106, and projector lens 107 cooperate to focus a TEM image. The TEM image obtained in this way is captured by the imager 108.

The operation of the electron microscope 100 when the accelerating voltage is modified is next described. In the electron gun 101, the optical settings of the electron source 110, extraction electrode 120, entrance side electrode 130, monochromator 140 (electrodes and magnetic coils of the energy filter), and exit side electrode 150 are constant regardless of the accelerating voltage.

If the accelerating voltage is decreased, for example, from 200 kV to 100 kV, the voltage applied to the top stage of acceleration voltage 170a drops. At this time, if the voltage applied to the inlet electrode 160 is constant irrespective of the accelerating voltage, the magnitude of the electrostatic lens EL30 drops, so that the position of the crossover CO2 will vary from its position assumed prior to the variation of the accelerating voltage.

Therefore, in the present embodiment, the controller 109b controls the inlet electrode voltage supply 162 such that the ratio between the voltage applied to the inlet electrode 160 and the voltage applied to the top stage of acceleration electrode 170a is kept constant. In particular, the controller 109b controls the inlet electrode voltage supply 162 in such a way that the voltage applied to the inlet electrode 160 is in proportion to the accelerating voltage. As such, if the accelerating voltage is modified, the ratio between the voltage applied to the inlet electrode 160 and the voltage applied to the top stage of acceleration electrode 170a remains constant. Also, the lens action of the electrostatic lens EL30 is constant. As a result, in the electron microscope 100, if the accelerating voltage is modified, the position of the crossover CO2 does not vary.

The operation of the optical system excluding the electron gun 101 of the electron microscope 100 when the accelerating voltage is modified is as described above and so a description thereof is omitted.

The electron microscope 100 associated with the present embodiment has the following features. In the electron microscope 100, the inlet electrode 160 is placed in a stage preceding the acceleration tube 170. A lens action is created between this inlet electrode 160 and the top stage of acceleration electrode 170a. The lens action forms the crossover CO2 of the electron beam. If the accelerating voltage is modified, the controller 109b controls the inlet electrode voltage supply 162 such that the ratio between the voltage applied to the inlet electrode 160 and the voltage applied to the top stage of acceleration electrode 170a is kept constant. Consequently, if the accelerating voltage is modified, the lens action of the electrostatic lens EL30 can be made constant. Therefore, in the electron microscope 100, if the accelerating voltage is modified, the position of the crossover CO2 of the electron beam can be held constant. In this way, in the electron microscope 100, even if the accelerating voltage is modified, the position of the crossover CO2 of the electron beam remains unchanged and so, if the accelerating voltage is modified, an electron beam brightness sufficient for imaging can be obtained.

Figure 3:
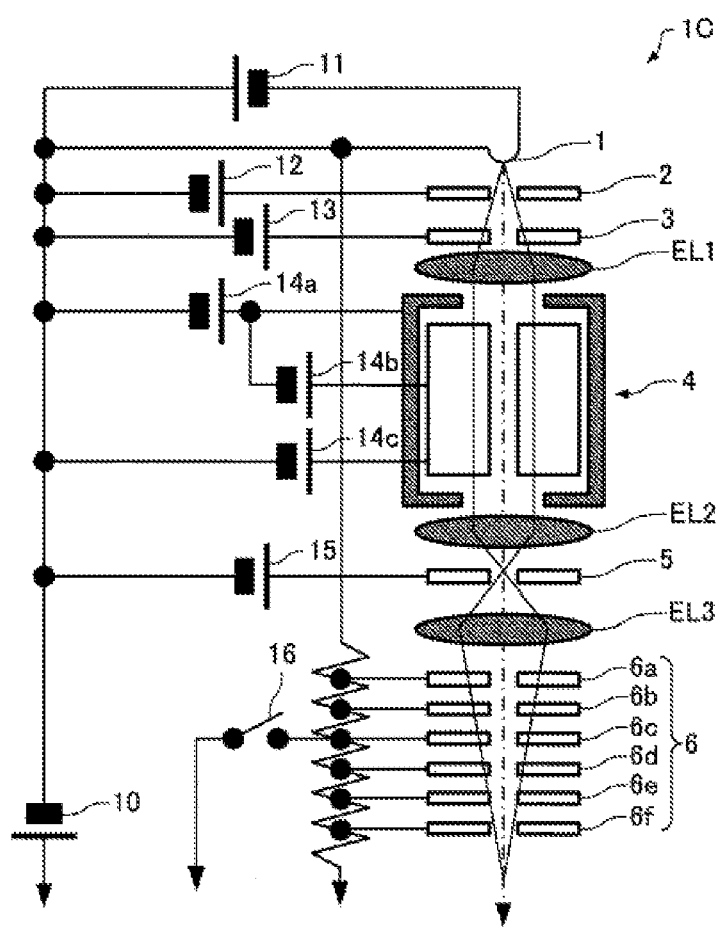
FIG. 3 is a schematic cross section similar to FIG. 2, but showing a conventional electron gun.
Figure 7:
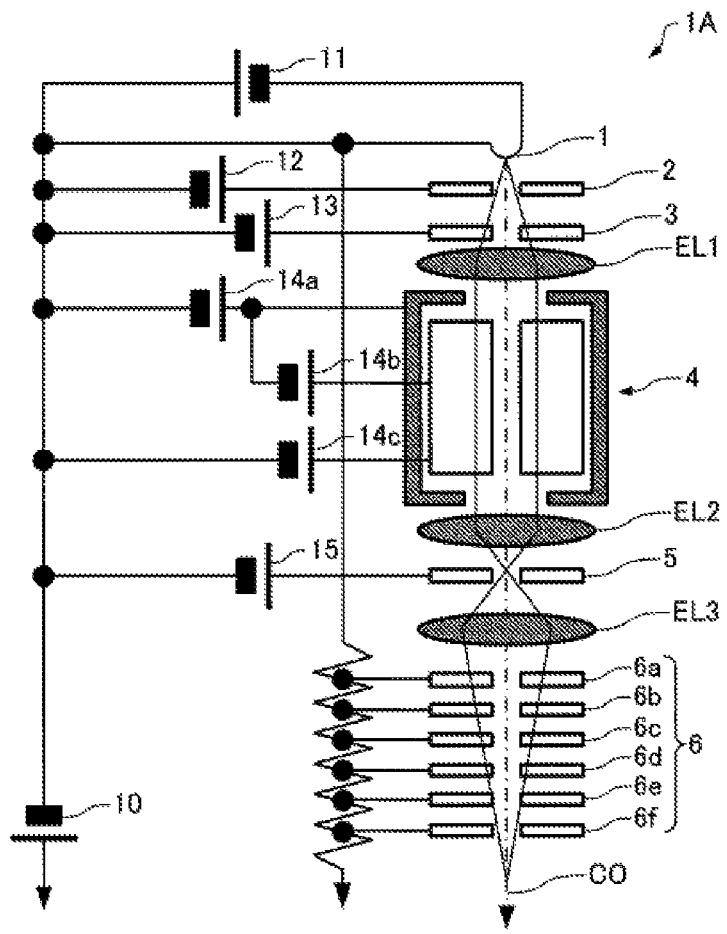
FIG. 7 is a schematic cross section, partly in circuit diagram form, of a conventional electron gun.
Figure 8:
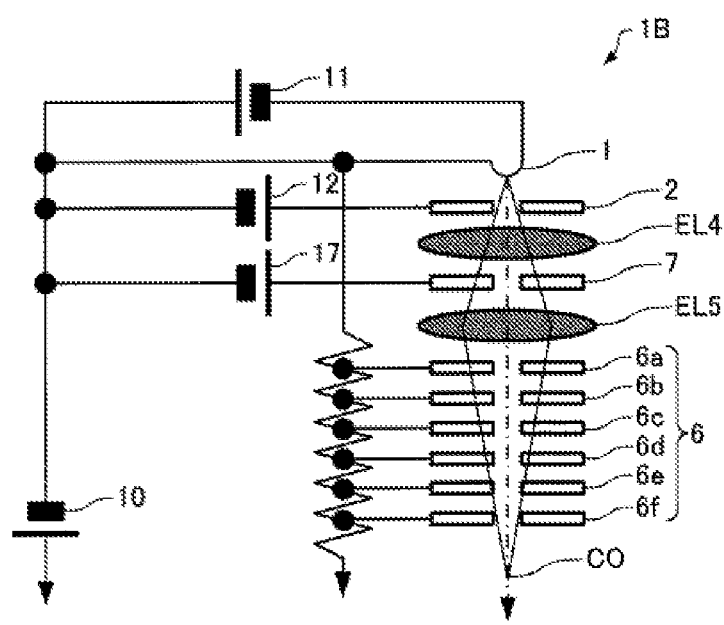
FIG. 8 is a schematic cross section, partly in circuit diagram form, of another conventional electron gun.

FIG. 3 is a schematic cross section showing a conventional electron gun 1C. Those components of the electron gun 1C of FIG. 3 which are similar in function to their respective counterparts of the electron gun 1A shown in FIG. 7 are indicated by the same reference numerals as in FIG. 3. The advantageous effects of the electron microscope 100 are described by comparing the conventional electron gun 1C shown in FIG. 3 with the electron gun 101 of the electron microscope 100 associated with the present embodiment.

For example, when the accelerating voltage is lowered from 200 kV to 100 kV, the voltage applied to the top stage of acceleration electrode 6a in the electron gun 1C can be raised by short-circuiting the middle stage of the acceleration tube 6 to ground potential by the use of a short switch 16 as shown in FIG. 3. Consequently, if the accelerating voltage is lowered, the lens action of the electrostatic lens EL3 can be kept constant, and the position of the crossover can be maintained unchanged.

However, in order to short-circuit the middle stage of the acceleration tube 6, the emission of the electron source 1 must be interrupted and the accelerating voltage must be brought to ground potential to prevent electrical discharge. Therefore, whenever the accelerating voltage is varied, the instrument must be stopped, which is inconvenient to the user. Further, after short-circuiting the middle stage of the acceleration tube 6, the electron gun 1C needs to be set into operation again. This deteriorates the processing capability. For example, where the electron source 1 is a Schottky emitter, it takes several hours until the electron gun 1C operates stably since startup of the electron gun 1C.

On the other hand, in the electron microscope 100 associated with the present embodiment, if the accelerating voltage is modified, the position of the crossover CO2 can be kept unchanged because the controller 109b controls the inlet electrode voltage supply 162 as described above. Thus, it is not necessary to stop the instrument. Therefore, in the electron microscope 100, the accelerating voltage can be switched faster than the electron microscope equipped with the conventional electron gun 1C and hence the electron microscope 100 can have enhanced processing capability.

Because the electron microscope 100 associated with the present embodiment includes the monochromator 140 for monochromatizing the electron beam, it is possible to perform electron energy loss spectroscopy at high energy resolutions and TEM imaging at high spatial resolutions.

1.3. Modifications

Modifications of the electron microscope associated with the present embodiment are next described.

(1) First Modification

Figure 4:
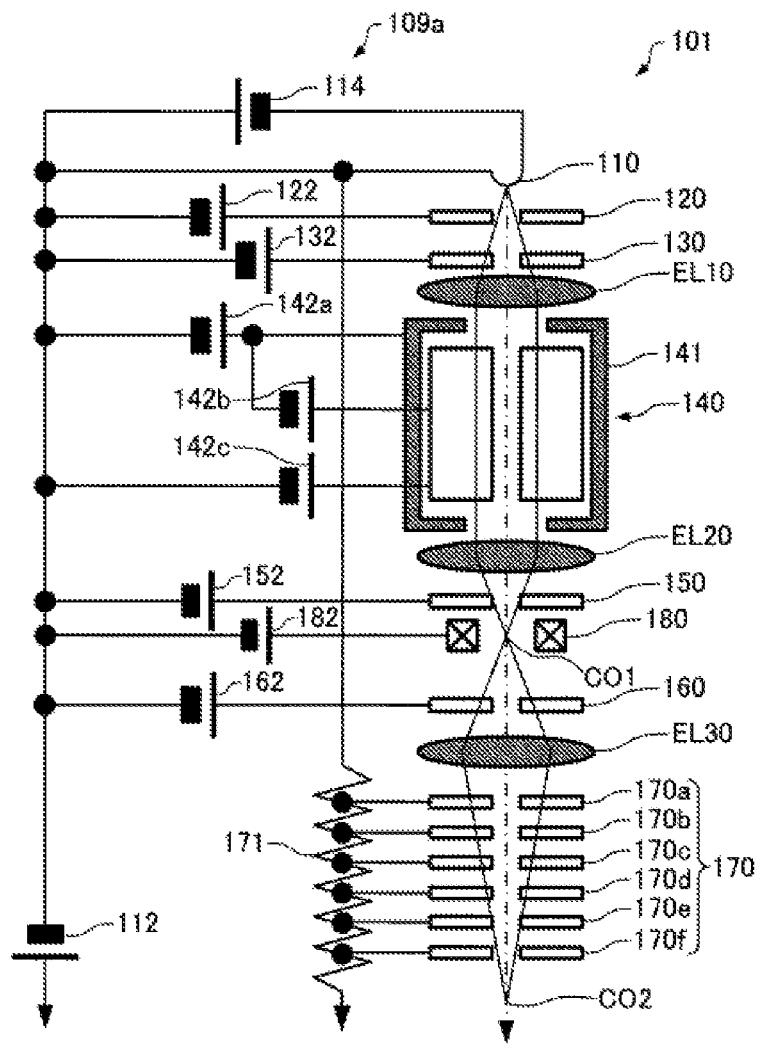
FIG. 4 is a schematic cross section similar to FIG. 2, but showing an EM electron gun associated with a first modification of the first embodiment.

The configuration of an electron microscope associated with a first modification is first described. FIG. 4 schematically shows an electron gun 101 included in the electron microscope associated with the first modification. Those members of the electron gun 101 of the electron microscope associated with the first modification which are similar in function to their respective counterparts of the electron gun 101 shown in FIG. 2 are indicated by the same reference numerals as in FIG. 2 and a detailed description thereof is omitted.

As shown in FIG. 4, in the electron microscope associated with the first modification, the electron gun 101 is configured including a deflector 180. This electron microscope is different from the electron microscope 100 in that the power supply 109a (see FIG. 1) is configured including a current supply 182 for the deflector. This electron microscope is similar in configuration to the electron microscope 100 shown in FIG. 1 except for both electron gun 101 and power supply 109a and so their description and illustration are omitted.

The deflector 180 is disposed between the exit side electrode 150 and the inlet electrode 160 and can deflect the electron beam. For example, the deflector 180 is a deflection coil for deflecting the electron beam by producing a magnetic field. Axial deviation of the electron beam caused when the voltage applied to the inlet electrode 160 is varied can be corrected by placing and operating the deflector 180.

The deflector 180 is placed, for example, in the position of the crossover CO1 of the electron beam formed by the lens action of the electrostatic lens EL20 produced between the monochromator 140 and the exit side electrode 150. This makes it possible to adjust only the angle of incidence of the electron beam relative to the optical axis by placing the deflector 180 in the position of the crossover CO1. That is, by deflecting the electron beam with the deflector 180, only the angle of incidence of the electron beam at the crossover CO2 can be modified without varying the position of the crossover CO2.

The deflector current supply 182 supplies electrical current to the deflector 180. The deflector current supply 182 takes the output voltage of the accelerating voltage supply 112 as ground potential (reference potential). Since the output of the deflector current supply 182 is superimposed on the accelerating voltage, the deflector current supply 182 can control the output independently of the accelerating voltage.

Then, the operation of the electron microscope associated with the first modification is described. Only the differences with the operation of the above-described electron microscope 100 are described below; a description of similarities is omitted.

The electron microscope associated with the first modification is different from the above-described electron microscope 100 in the operation performed when the accelerating voltage is modified. In the electron gun 101 of the electron microscope associated with the first modification, the optical settings of the electron source 110, extraction electrode 120, entrance side electrode 130, monochromator 140, and exit side electrode 150 are constant regardless of the accelerating voltage.

When the accelerating voltage is modified, the controller 109b controls the inlet electrode voltage supply 162 such that the ratio between the voltage applied to the inlet electrode 160 and the voltage applied to the top stage of acceleration electrode 170a is kept constant. Consequently, if the accelerating voltage is modified, the lens action of the electrostatic lens EL30 remains constant. As a result, in the electron microscope associated with the first modification, if the accelerating voltage is modified, the position of the crossover CO2 remains unchanged.

Furthermore, as described previously, the optical settings of the electron source 110, extraction electrode 120, entrance side electrode 130, monochromator 140, and exit side electrode 150 are constant regardless of the accelerating voltage and so if the accelerating voltage is modified, the crossover CO1 is formed between the exit side electrode 150 and the inlet electrode 160. In the first modification, the deflector 180 disposed at the position of the crossover CO1 permits making an adjustment such that the electron beam passes through the center of the electrostatic lens EL30 formed by both the inlet electrode 160 and the top stage of acceleration electrode 170a. Consequently, it is possible to correct any axial deviation of the electron beam caused when the voltage applied to the inlet electrode 160 is varied.

The electron microscope associated with the first modification has the following features. In the electron microscope associated with the first modification, if the accelerating voltage is modified, the position of the crossover CO2 can be maintained unchanged by controlling the inlet electrode voltage supply 162 by means of the controller 109b in the same way as in the above-described electron microscope 100.

In the electron microscope associated with the first modification, the electron gun 101 includes the deflector 180 disposed between the exit side electrode 150 and the inlet electrode 160. Therefore, any axial deviation of the electron beam caused when the voltage applied to the inlet electrode 160 is varied can be corrected. Hence, aberrations arising from axial deviation of the electron beam can be reduced.

In the electron microscope associated with the first modification, the deflector 180 is positioned in the position of the crossover CO1 of the electron beam formed by the lens action produced between the monochromator 140 and the exit side electrode 150. Therefore, only the angle of incidence of the electron beam relative to the optical system can be adjusted by the deflector 180. Consequently, the deflector 180 can prevent any unwanted variations of the position of the electron beam; otherwise, the operator might miss the electron beam.

(2) Second Modification

Figure 5:
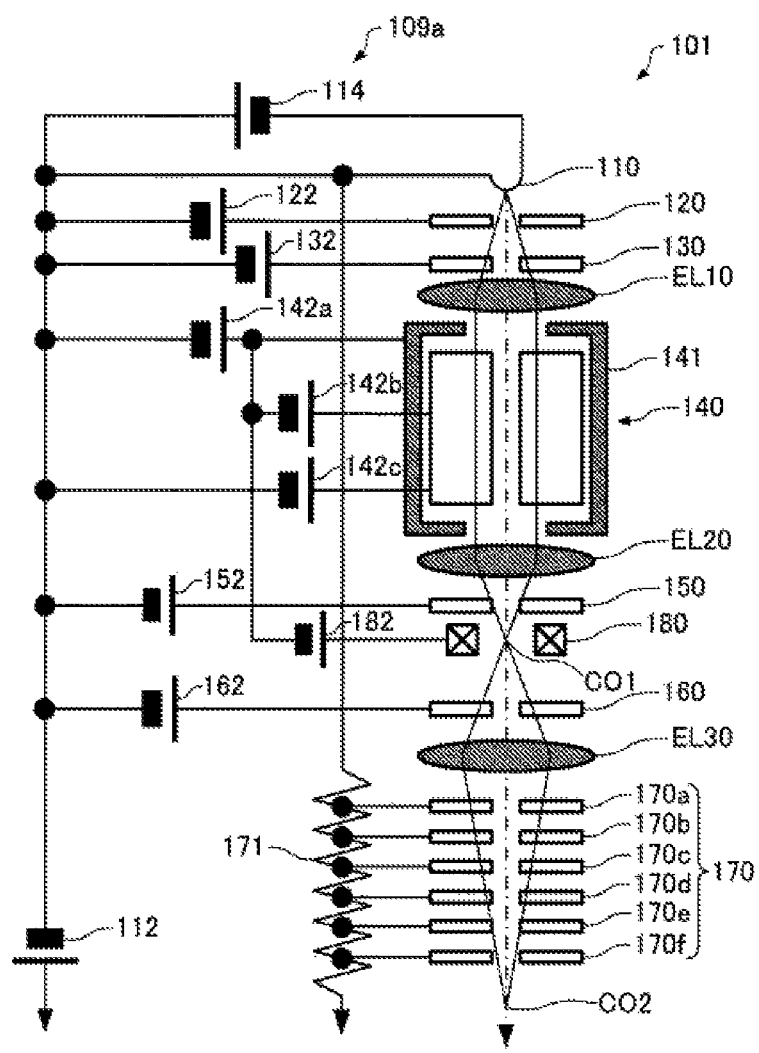
FIG. 5 is a schematic cross section similar to FIG. 2, but showing an EM electron gun associated with a second modification of the first embodiment.

The configuration of an electron microscope associated with a second modification is next described by referring to FIG. 5, which schematically shows an electron gun 101 included in the electron microscope associated with the second modification. Those members of the electron gun 101 of the electron microscope associated with the second modification which are similar in function to their respective counterparts of the electron gun 101 shown in FIG. 2 and the electron gun 101 shown in FIG. 4 are indicated by the same reference numerals as in FIGS. 2 and 4 and a detailed description thereof is omitted.

In the electron microscope associated with the first modification, the deflector current supply 182 takes the output voltage of the accelerating voltage supply 112 as ground potential (reference potential) as shown in FIG. 4. On the other hand, in the electron microscope associated with the second modification, the deflector current supply 182 takes the output voltage (enclosure voltage) of the monochromator voltage supply 142a as ground potential (reference potential) as shown in FIG. 5.

The output of the deflector current supply 182 is superimposed on the output of the monochromator power supply 142a so as to minimize the potential difference relative to the monochromator 140, taking account of the withstand voltage of the deflector (deflection coil) 180. Consequently, electrical discharge between the deflector 180 and the monochromator 140 can be prevented. This can prevent damage to the deflector (deflection coil) 180 and to the deflector current supply 182. The operation of the electron microscope associated with the second embodiment is the same as that of the electron microscope associated with the first modification and a description thereof is omitted.

2. Second Embodiment 2.1. Configuration of Electron Microscope

Figure 6:
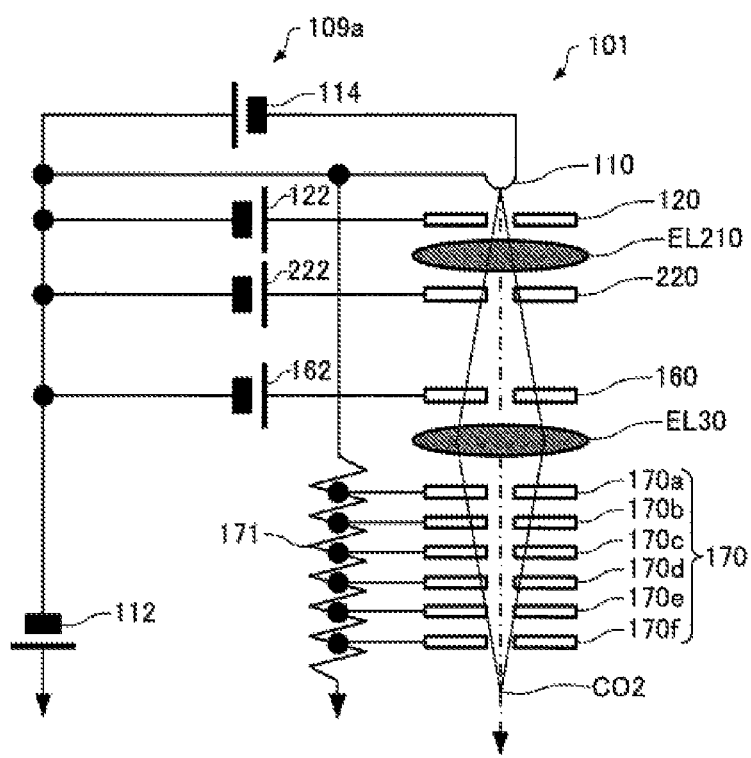
FIG. 6 is a schematic cross section, partly in circuit diagram form, of an EM electron gun associated with a second embodiment of the present invention.

An electron microscope associated with a second embodiment is next described by referring to FIG. 6, which schematically shows an electron gun 101 included in the electron microscope associated with the second embodiment. Those members of the electron gun 101 of the electron microscope associated with the second embodiment which are similar in function to their respective counterparts of the electron gun 101 shown in FIG. 2 are indicated by the same reference numerals as in FIG. 2 and a detailed description thereof is omitted.

In the electron microscope 100 associated with the first embodiment, the electron gun 101 is configured including the monochromator 140 as shown in FIG. 2. On the other hand, in the electron microscope associated with the second embodiment, the electron gun 101 has no monochromator as shown in FIG. 6.

This electron microscope associated with the second embodiment is similar in configuration to the electron microscope 100 shown in FIG. 1 except for the electron gun 101 and power supply 109a and so a description and illustration thereof is omitted.

In the present embodiment, the electron gun 101 is configured including an electron source 110, an extraction electrode 120, a second electrode 220, an inlet electrode 160, and an acceleration tube 170 as shown in FIG. 6. The power supply 109a is configured including an accelerating voltage supply 112, a filament voltage supply 114, an extraction electrode voltage supply 122, a second electrode voltage supply 222, and an inlet electrode voltage supply 162.

The second electrode 220 is located in a stage following the extraction electrode 120. The second electrode 220 is disposed between the extraction electrode 120 and the inlet electrode 160. A lens action is produced between the second electrode 220 and the extraction electrode 120. In the example shown in FIG. 6, the second electrode 220 and extraction electrode 120 cooperate to produce an electrostatic lens EL210, which in turn adjusts the orbit of the electron beam emitted from the electron source 110. The second electrode 220 is connected with the second electrode voltage supply 222.

In the present embodiment, the inlet electrode 160 is disposed in a stage following the second electrode 220. The second electrode voltage supply 222 supplies a voltage to the second electrode 220. The second electrode voltage supply 222 takes the output voltage of the accelerating voltage supply 112 as ground potential (reference potential). Because the output of the second electrode voltage supply 222 is superimposed on the accelerating voltage, the second electrode voltage supply 222 can control the output independent of the accelerating voltage.

The controller 109b (see FIG. 1) controls the inlet electrode voltage supply 162 in the same way as for the electron microscope 100. In particular, if the accelerating voltage is modified, the controller 109b controls the inlet electrode voltage supply 162 such that the ratio between the voltage applied to the inlet electrode 160 and the voltage applied to the top stage of acceleration electrode 170a is maintained constant.

In addition, in the present embodiment, the controller 109b controls the second electrode voltage supply 222 in such a way that, if the extraction voltage applied to the extraction electrode 120 is modified, the ratio between the voltage applied to the second electrode 220 and the extraction voltage applied to the extraction electrode 120 is kept constant.

2.2. Operation of Electron Microscope

The operation of the electron microscope associated with the second embodiment is next described. Only the differences with the above-described operation of the electron microscope 100 are described; a description of similarities is omitted.

(1) Operation when the Acceleration Voltage is Modified

In the electron gun 101 of the electron microscope associated with the second embodiment, the optical settings of the electron source 110, extraction electrode 120, and second electrode 220 are constant regardless of the accelerating voltage.

The controller 109b controls the inlet electrode voltage supply 162 in such a way that, if the accelerating voltage is modified, the ratio between the voltage applied to the inlet electrode 160 and the voltage applied to the top stage of accelerating voltage 170a is kept constant. Consequently, if the accelerating voltage is modified, the lens action of the electrostatic lens EL30 remains constant. As a result, in the electron microscope associated with the second embodiment, if the accelerating voltage is modified, the position of the crossover CO2 remains unchanged.

(2) Operation when the Extraction Voltage is Modified

In the electron microscope associated with the second embodiment, the extraction voltage applied to the extraction electrode 120 is varied in order to adjust the magnitude of the electron beam (i.e., the amount of electrons) emitted from the electron source 110. At this time, if the voltage applied to the second electrode 220 is constant regardless of the extraction voltage, the magnitude of the electrostatic lens EL210 varies, whereby the orbit of the electron beam will deviate.

Therefore, in the present embodiment, the controller 109b controls the second electrode voltage supply 222 such that the ratio between the extraction voltage applied to the extraction electrode 120 and the voltage applied to the second electrode 220 is kept constant. In particular, the controller 109b controls the second electrode voltage supply 222 such that the voltage applied to the second electrode 220 is in proportion to the extraction voltage. Consequently, if the extraction voltage is modified, the ratio between the extraction voltage applied to the extraction electrode 120 and the voltage applied to the second electrode 220 is kept constant. Also, the lens action of the electrostatic lens EL210 remains constant. As a result, in the electron microscope associated with the present embodiment, if the extracting voltage is modified, the orbit of the electron beam can be made constant.

The electron microscope associated with the second embodiment has the following features. In the electron microscope associated with the second embodiment, the position of the crossover CO2 can be maintained unchanged by controlling the inlet electrode voltage supply 162 by means of the controller 109b if the accelerating voltage is modified, in the same way as for the above-described electron microscope 100.

Furthermore, in the electron microscope associated with the second embodiment, the controller 109b controls the second electrode voltage supply 222 in such a way that, if the extraction voltage is modified, the ratio between the extraction voltage applied to the extraction electrode 120 and the voltage applied to the second electrode 220 is kept constant. Consequently, if the extraction voltage is modified, the lens action of the electrostatic lens EL210 can be maintained constant. Thus, in the electron microscope associated with the second embodiment, if the extraction voltage is modified, the lens action of the electrostatic lens EL210 does not vary the orbit of the electron beam.

In addition, in the electron microscope associated with the second embodiment, the electron gun 101 has the inlet electrode 160 and, therefore, if the extraction voltage is modified, the electrostatic lens EL30 produced between the inlet electrode 160 and the top stage of accelerating electrode 170a is not affected. Consequently, in the electron microscope associated with the second embodiment, if the extraction voltage is modified, the position of the crossover CO2 can be kept constant.

In the above description of the electron microscope associated with the second embodiment, the controller 109b controls both the inlet electrode voltage supply 162 and the second electrode voltage supply 222. Alternatively, the controller 109b may control only the inlet electrode voltage supply 162 or only the second electrode voltage supply 222.

It is to be noted that the above embodiments and modifications are merely exemplary and that the invention is not restricted thereto. For example, the embodiments and modifications may be combined appropriately.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described my invention with the detail and particularity required by the Patent Laws, what is desired protected by Letters Patent is set forth in the following claims.

The invention claimed is:

1. An electron microscope comprising:
an electron source for emitting an electron beam;
an acceleration tube which has plural stages of acceleration electrodes stacked one above the other and which is operative to accelerate the electron beam;

a first electrode separate from the acceleration tube and operative such that a lens action is produced between this first electrode and the initial stage of acceleration electrode of the plural stages of acceleration electrodes;

an accelerating voltage supply for supplying an accelerating voltage to the acceleration tube;

a first electrode voltage supply for supplying a voltage to the first electrode; and a controller for controlling the first electrode voltage supply, wherein the lens action produced between the first electrode and the initial stage of acceleration electrode forms a crossover of the electron beam, and wherein the controller controls the first electrode voltage supply such that, if the accelerating voltage is modified, the ratio between the voltage applied to the first electrode and a voltage applied to the initial stage of acceleration electrode is kept constant.

2. The electron microscope as set forth in claim 1, further comprising:

a monochromator for monochromatizing said electron beam;

an entrance side electrode disposed on an entrance side of the monochromator and operative such that a lens action is produced between this entrance side electrode and the monochromator; and an exit side electrode disposed on an exit side of the monochromator and operative such that a lens action is produced between this exit side electrode and the monochromator.

3. The electron microscope as set forth in claim 2, further comprising a deflector disposed between said exit side electrode and said first electrode and operative to deflect said electron beam.

4. The electron microscope as set forth in claim 3, wherein said deflector is placed in the position of the crossover of said electron beam formed by the lens action produced between said monochromator and said exit side electrode.

5. The electron microscope as set forth in claim 1, further comprising:

an extraction electrode for extracting said electron beam from said electron source; and a second electrode operative such that a lens action is produced between this second electrode and the extraction electrode.

6. The electron microscope as set forth in claim 5, further comprising:

an extraction electrode voltage supply for supplying an extraction voltage to said extraction electrode; and a second electrode voltage supply for supplying a voltage to said second electrode, wherein said controller further controls the second electrode voltage supply such that, if said extraction voltage is modified, the ratio between the voltage applied to the extraction electrode and the voltage applied to the second electrode is kept constant.

7. An electron microscope comprising:

an electron source for emitting an electron beam;

an extraction electrode for extracting the electron beam from the electron source;

an acceleration tube which has plural stages of acceleration electrodes stacked one above the other and which is operative to accelerate the electron beam;

a first electrode separate from the acceleration tube and operative such that a lens action is produced between this first electrode and the initial stage of acceleration electrode of the plural stages of acceleration electrodes;

a second electrode disposed between the extraction electrode and the first electrode and operative such that a lens action is produced between this second electrode and the extraction electrode;

an extraction electrode voltage supply for supplying an extraction voltage to the extraction electrode;

a second electrode voltage supply for supplying a voltage to the second electrode; and a controller for controlling the second electrode voltage supply, wherein the lens action produced between the first electrode and the initial stage of acceleration electrode forms a crossover of the electron beam, and wherein the controller controls the second electrode voltage supply such that, if the extraction voltage is modified, the ratio between the voltage applied to the extraction electrode and the voltage applied to the second electrode is kept constant.

8. A method of controlling an electron microscope including an electron source for emitting an electron beam, an acceleration tube which has plural stages of acceleration electrodes stacked one above the other and which is operative to accelerate the electron beam, a first electrode separate from the acceleration tube and operative such that a lens action is produced between this first electrode and the initial stage of acceleration electrode of the plural stages of acceleration electrodes, an accelerating voltage supply for supplying an accelerating voltage to the acceleration tube, and a first electrode voltage supply for supplying a voltage to the first electrode, said first electrode and said initial stage of acceleration electrode cooperating to produce a lens action therebetween, whereby forming a crossover of the electron beam, said method comprising the step of:

controlling the first electrode voltage supply such that, if the accelerating voltage is modified, the ratio between the voltage applied to the first electrode and the voltage applied to the initial stage of accelerating electrode is kept constant.

9. A method of controlling an electron microscope including an electron source for emitting an electron beam, an extraction electrode for extracting the electron beam from the electron source, an acceleration tube which has plural stages of acceleration electrodes stacked one above the other and which is operative to accelerate the electron beam, a first electrode separate from the acceleration tube and operative such that a lens action is produced between this first electrode and the initial stage of acceleration electrode of the plural stages of acceleration electrodes, a second electrode disposed between the extraction electrode and the first electrode and operative such that a lens action is produced between this second electrode and the extraction electrode, an extraction electrode voltage supply for supplying an extraction voltage to the extraction electrode, and a second electrode voltage supply for supplying a voltage to the second electrode, said first electrode and the initial stage of acceleration electrode cooperating to produce a lens action therebetween, whereby forming a crossover of the electron beam, said method comprising the step of:

controlling the second electrode voltage supply such that, if the extraction voltage is modified, the ratio between the voltage applied to the extraction electrode and the voltage applied to the second electrode is kept constant.

* * * * *